United States Patent [19]
Zwick

[11] Patent Number: 5,690,766
[45] Date of Patent: Nov. 25, 1997

[54] METHOD AND APPARATUS FOR DECREASING THE TIME NEEDED TO DIE BOND MICROELECTRONIC CHIPS

[75] Inventor: Kenneth John Zwick, Philadelphia, Pa.

[73] Assignee: The Trustees of the University of Pennsylvania, Philadelphia, Pa.

[21] Appl. No.: 515,863

[22] Filed: Aug. 16, 1995

[51] Int. Cl.$^6$ ................................................ B32B 31/16
[52] U.S. Cl. .......................... 156/73.6; 264/69; 29/832
[58] Field of Search .......................... 156/73.1, 73.5, 156/73.6, 580, 580.1, 580.2; 264/29; 29/832

[56] References Cited

U.S. PATENT DOCUMENTS

| | | | |
|---|---|---|---|
| 3,481,839 | 12/1969 | Inoue | 204/14 |
| 3,925,126 | 12/1975 | Leatherman et al. | 156/73.6 |
| 3,956,821 | 5/1976 | Martin | 29/590 |
| 3,991,933 | 11/1976 | Antonevich | 228/110 |
| 4,145,390 | 3/1979 | Zschimmer | 264/69 |
| 4,443,509 | 4/1984 | Sauder | 428/137 |
| 4,602,730 | 7/1986 | Murakami et al. | 228/37 |
| 4,684,056 | 8/1987 | Deambrosio | 228/180.1 |
| 4,831,724 | 5/1989 | Elliott | 29/840 |
| 4,869,418 | 9/1989 | Simpson et al. | 228/37 |
| 4,879,564 | 11/1989 | Long | 346/25 |
| 4,908,631 | 3/1990 | DeBoer et al. | 346/76 R |
| 5,160,659 | 11/1992 | von Benda et al. | 252/182.1 |
| 5,228,614 | 7/1993 | Elliott et al. | 228/37 |
| 5,361,964 | 11/1994 | Sim | 228/56.2 |
| 5,435,715 | 7/1995 | Probst | 425/174.2 |

*Primary Examiner*—James Sells
*Attorney, Agent, or Firm*—Woodcock Washburn Kurtz Mackiewicz & Norris LLP

[57] ABSTRACT

Disclosed is a die bonding system comprising a conveyor 10, a speaker 12 and a function generator 14. The conveyor 10 carries a leadframe 14 bearing a prescribed quantity of die bonding epoxy 16. At a station situated above the speaker 12, a chip 18 is pressed down with a force F onto the epoxy and leadframe. While this force is being applied, the function generator 14 excites the speaker 12 to generate an acoustic signal sufficient to effect the vibration of the epoxy relative to the leadframe at a frequency of about 250 Hz and an amplitude of approximately 10 to 50 μm, preferably 20 μm. Such a vibration causes the epoxy to flow freely to a thin, uniform thickness, and thus permits the chip to be quickly bonded to the leadframe with a small force.

22 Claims, 1 Drawing Sheet

METHOD AND APPARATUS FOR DECREASING THE TIME NEEDED TO DIE BOND MICROELECTRONIC CHIPS

FIELD OF THE INVENTION

The present invention relates generally to the field of bonding processes, and more particularly to die bonding of microelectronic chips.

BACKGROUND OF THE INVENTION

In microelectronic packages, two important functions are served by the die bond adhering the chip to the metal leadframe. First, the bond holds the chip securely in place so that electrical connections can be made in a subsequent operation. Second, the bond provides a path for conducting the heat generated by the chip to the leadframe, whence it is dissipated to the surroundings. The bond must be thin, uniform, and complete to avoid the development of hot spots on the chips, which may lead to thermal failure of the entire device. A silver-filled epoxy compound is commonly used as the bonding material, primarily because of its good thermal conductivity.

The die bonding process typically involves placing several drops of epoxy on the leadframe and then pressing the chip onto the leadframe with a constant force until a thin and uniform bond is achieved. This process takes a few tenths of a second with a 5 mm×5 mm chip, and the bond thickness is typically 25 µm. However, with increasing levels of circuit integration, the chips are becoming larger (e.g., up to 15 mm×15 mm) and the time necessary to achieve the desired bond thickness is increasing significantly. With very large chips, the desired bond thickness may, in fact, never be achieved. There are several reasons for this difficulty. Although improvements in die bonding machinery have decreased the time necessary to pick and place the chips and to dispense the epoxy in carefully controlled amounts, the extrusion or squeezing of the epoxy is still problematic. In view of the thinness of the chips, the force applied for epoxy extrusion cannot be increased beyond a certain limiting value in order to avoid chip material damage. Although newer chips have a larger surface area, they are not necessarily thicker and consequently can be more fragile. With a given magnitude of force and a chip size L, the pressure which drives the flow varies as $1/L^2$. Further, as the chip size increases, the volume of epoxy to extrude from beneath the chip varies as $L^2$, but the area through which the epoxy extrudes (the outer edge of the die) varies only as L. Therefore, higher flow velocities and shear rates are necessary to complete the die bonding process.

One method of increasing the speed of the bonding process is to scrub the chip tangentially to the leadframe surface while applying a constant pressure. The scrubbing step involves moving the chip in a plane parallel to the leadframe surface, and often causes the epoxy to flow more easily. A major problem with this process is that the chip must be gripped from the sides with a collet so that a tangential force may be imparted during scrubbing. Chips that are very thin and fragile are often damaged during this process.

U.S. Pat. No. 4,145,390, Mar. 20, 1979, titled "Process for Mounting Components on a Base by Means of a Thixotropic Material," discloses a bonding process whereby a thixotropic bonding material is vibrated, at an unspecified frequency in the range 1 Hz to 10 kHz and at a suggested amplitude of 0.5 mm (500 µm), to increase the liquification of the thixotropic material. It is believed that this process is similar to, and suffers the same disadvantages of, the scrubbing process described above, in that the chip must be gripped from the sides so that the tangential vibrational force may be applied. Further, it is believed that the suggested vibrational amplitude of 500 µm is too large for many applications and will result in an unacceptably large number of damaged chips.

SUMMARY OF THE INVENTION

Accordingly, an object of the present invention is to provide an improved system for die bonding microelectronic chips at a high speed without increasing the risk of damaging the chips.

According to the present invention, a method or system for bonding an integrated circuit chip to a lead frame comprises the steps of, or means for, applying an adhesive to a surface of the lead frame, pressing the chip onto the surface on which the adhesive is applied, and inducing vibrations of a predetermined frequency and amplitude in at least the leadframe. The vibrations are induced with an acoustic source so that the adhesive rheology is temporarily changed in situ. This permits the adhesive to flow to a predetermined thickness as the chip is pressed to a predetermined distance from the leadframe.

According to the invention, the epoxy rheology is changed temporarily in situ so that the epoxy flows more easily. This step may be performed by placing a device comprising a small speaker driven by a function generator beneath the leadframes as the chips are being pressed down onto the leadframes. If the leadframes are vibrated with a small amplitude motion caused by the acoustic pressure from the speaker, e.g., at a frequency of approximately 250 Hz and an amplitude of approximately 10–50 µm, and preferably about 20 µm, the epoxy will flow a great deal more freely. Calculations and experiments show that the flow time is greatly reduced for most chip sizes and forces. With the prior art, the largest chips must be die bonded by hand because a simple constant force will not extrude the epoxy down to a thin enough film. Using the present invention, even the larger chips can be bonded automatically.

The risk of damaging the chip is small with the small amplitude, mid-frequency vibration employed by the invention. Moreover, the vibration is preferably applied to the leadframe side of the chip/leadframe assembly, and most of it is absorbed in the epoxy, so the chip is not overly stressed. Further, with the low frequency, the required energy is relatively low.

Other features of the invention are described below.

BRIEF DESCRIPTION OF THE DRAWINGS

The figure depicts a presently preferred embodiment of a die bonding system in accordance with the present invention.

DETAILED DESCRIPTION OF PREFERRED EMBODIMENTS

Figure 1:
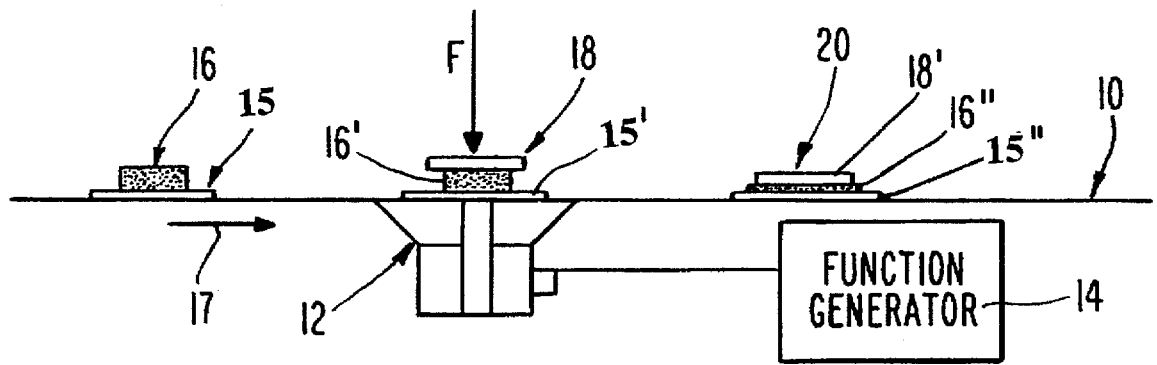

As shown in the drawing, a presently preferred embodiment of the invention comprises a conveyor 10, a speaker 12 and a function generator 14 arranged as shown. The conveyor 10 carries a leadframe 15 bearing a prescribed quantity of die bonding epoxy 16 from left to right, as indicated by the arrow 17. At a station situated above the speaker 12, a chip 18 is pressed down with a force F onto the epoxy and leadframe, which are now labelled with reference numerals 15' and 16'. The amount of force F is about 2 N. While this force is being applied, the function generator 14 excites the speaker 12 to generate an acoustic signal sufficient to effect the vibration of the epoxy 16' relative to the leadframe 15' at a frequency of about 250 Hz and an amplitude of approximately 20 µm. The present inventor has discovered that such a vibration will cause the epoxy to flow freely to a thin, uniform thickness, and thus will permit the chip 18 to be quickly bonded to the leadframe with a small force. The completed assembly 20 is then carried away from the bonding station so that the process can be repeated with other parts. (Reference numerals 15", 16" and 18' refer to the same elements, respectively, as reference numerals 15, 16 and 18. The prime and double-prime notation is employed to indicate that the corresponding elements are, to some extent, changed by the inventive process.)

By increasing the efficiency of the die bonding process, by reducing the damaged parts and the time needed to perform the process, the present invention could more than double the throughput of a die bonder making large chip packages. Such machines cost on the order of $300,000. Therefore, the invention offers a potential savings of $300,000 per machine installed.

As mentioned, the present invention provides a way of temporarily changing the epoxy rheology in situ so that the epoxy flows more easily, without gripping the chip. To the inventor's knowledge, no such method of flow enhancement has been employed previously in the microelectronics industry. The phenomenon underlying the invention is not limited to die bonding epoxy, but rather seems to affect fluids generally known as yield stress fluids. The effect has been demonstrated on die bonding epoxy, toothpaste, and mustard (for example, at about 275 Hz, the yield stress of mustard is so reduced that it becomes nearly Newtonian), but appears to be absent in Newtonian fluids such as oil and honey.

Variations and modifications of the particulars described above within the true spirit of the invention will be apparent to those skilled in the art in view of the present disclosure, and therefore, except as they may be expressly so limited, the scope of protection of the following claims is not limited to the particulars described above.

I claim:

1. A method of bonding an integrated circuit chip to a lead frame, comprising the steps of:

applying an adhesive to a surface of said lead frame;

pressing the chip onto said surface on which the adhesive is applied; and inducing, with an acoustic source, vibrations of a predetermined frequency and amplitude in at least said leadframe, said amplitude being approximately 10–50 μm, wherein the vibrations are induced with acoustic pressure waves that induce a vibrational force in said adhesive and chip, said force being substantially perpendicular to the chip surface in contact with said adhesive, whereby the adhesive rheology is temporarily changed in situ so that the adhesive flows to a predetermined thickness to permit the chip to be pressed to a predetermined distance from said leadframe.

2. The method recited in claim 1 wherein said adhesive comprises an epoxy compound.

3. The method recited in claim 1 wherein the pressing step comprises pressing the chip onto said surface with a constant force.

4. The method recited in claim 1 wherein said step of inducing vibrations in at least said leadframe further comprises subjecting at least said leadframe to acoustic pressure waves characterized by a frequency of approximately 250 Hz and an amplitude of approximately 20 μm.

5. The method recited in claim 1 wherein the acoustic pressure waves are generated by a speaker.

6. The method recited in claim 5 wherein said adhesive comprises an epoxy compound, and the pressing step comprises pressing the chip onto said surface with a constant force.

7. A die bonding system for bonding an integrated circuit chip to a surface of a leadframe, wherein an adhesive is carried on said surface, comprising:

means for pressing the chip onto said surface on which the adhesive is applied; and means for inducing, with an acoustic source, vibrations of a predetermined frequency and amplitude in at least said leadframe, said amplitude being approximately 10–50 μm, wherein the vibrations are induced with acoustic pressure waves that induce a vibrational force in said adhesive and chip, said force being substantially perpendicular to the chip surface in contact with said adhesive, whereby the adhesive rheology is temporarily changed in situ so that the adhesive flows to a predetermined thickness to permit the chip to be pressed to a predetermined distance from said leadframe.

8. The system recited in claim 7 wherein said adhesive comprises an epoxy compound.

9. The system recited in claim 7 wherein the means for pressing comprises means for pressing the chip onto said surface with a constant force.

10. The system recited in claim 7 wherein said means for inducing vibrations in at least said leadframe subjects at least said leadframe to acoustic pressure waves characterized by a frequency of approximately 250 Hz and an amplitude of approximately 20 μm.

11. The system recited in claim 7 wherein said means for inducing vibrations comprises a speaker.

12. The system recited in claim 11 wherein said means for inducing vibrations further comprises a function generator operatively coupled to said speaker.

13. The system recited in claim 12 wherein said adhesive comprises an epoxy compound, and said means for pressing comprises means for pressing the chip onto said surface with a constant force.

14. A process for die bonding a microelectronic chip to a leadframe with an adhesive characterized as a yield stress fluid, comprising the steps of temporarily changing in situ the rheology of said adhesive without gripping said chip by inducing a vibrational force in a direction which is substantially perpendicular to a surface of said chip which is in contact with said adhesive, and pressing said chip so that said adhesive flows to a predetermined thickness and said chip is positioned a predetermined distance from said leadframe.

15. The process recited in claim 14 comprising inducing acoustic vibrations of a predetermined frequency and amplitude in at least said leadframe.

16. The process recited in claim 15 wherein said predetermined frequency is approximately 250 Hz.

17. The process recited in claim 15 wherein said predetermined amplitude ms approximately 10–50 μm.

18. The process recited in claim 16 wherein said predetermined amplitude is approximately 10–50 μm.

19. The process recited in claim 17 wherein said predetermined amplitude ms approximately 20 μm.

20. The process recited in claim 18 wherein said predetermined amplitude is approximately 20 μm.

21. The process recited in claim 5, wherein said predetermined amplitude is approximately 20 μm.

22. The system recited in claim 10 wherein said predetermined amplitude is approximately 20 μm.

* * * * *